(12) United States Patent
Kim (10) Patent No.: US 9,484,548 B2
(45) Date of Patent: Nov. 1, 2016

(54) ORGANIC LIGHT EMITTING DIODE DISPLAY

(71) Applicant: Samsung Display Co., LTD., Yongin, Gyeonggi-Do (KR)

(72) Inventor: Myung Su Kim, Seongnam-si (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/632,912

(22) Filed: Feb. 26, 2015

(65) Prior Publication Data
US 2015/0243919 A1 Aug. 27, 2015

(30) Foreign Application Priority Data

Feb. 27, 2014 (KR) .......................... 10-2014-0023588

(51) Int. Cl.
*H01L 51/56* (2006.01)
*H01L 51/52* (2006.01)
*H01L 51/50* (2006.01)

(52) U.S. Cl.
CPC ....... *H01L 51/5206* (2013.01); *H01L 51/5012* (2013.01); *H01L 2251/5346* (2013.01); *H01L 2251/55* (2013.01)

(58) Field of Classification Search
CPC . H01L 27/322; H01L 27/323; H01L 27/326; H01L 27/3262; H01L 27/3258; H01L 51/56; H01L 51/5072; H01L 51/5256; H01L 51/5284
See application file for complete search history.

(56) References Cited

U.S. PATENT DOCUMENTS

2013/0043498 A1\* 2/2013 Pyo ..................... H01L 51/0013
257/89

FOREIGN PATENT DOCUMENTS

| KR | 1020030064625 A | 8/2003 |
| KR | 1020050037913 A | 4/2005 |
| KR | 1020130063974 A | 6/2013 |

OTHER PUBLICATIONS

H.H. Fong et al., "Hole transports in molecularly doped triphenylamine derivative", Chemical Physics Letters 353, (Feb. 26, 2002), p. 407-413, Elsevier, Department of Physics—Hong Kong Baptist University, Hong Kong China.

\* cited by examiner

*Primary Examiner* — Kyoung Lee
(74) *Attorney, Agent, or Firm* — Robert E. Bushnell, Esq.

(57) ABSTRACT

An organic light emitting device includes a pixel electrode, a hole auxiliary layer formed on the pixel electrode, an organic emission layer formed on the hole auxiliary layer, an electron auxiliary layer formed on the organic emission layer, and a common electrode layer formed on the electron auxiliary layer. An electric field dependency of electron mobility is increased by increasing an energetic disorder or decreasing a positional disorder for the organic emission layer.

7 Claims, 7 Drawing Sheets

ORGANIC LIGHT EMITTING DIODE DISPLAY

CLAIM OF PRIORITY

This application claims priority to and the benefit of Korean Patent Application No. 10-2014-0023588 filed in the Korean Intellectual Property Office on Feb. 27, 2014, the entire contents of which are incorporated herein by reference.

BACKGROUND OF THE INVENTION

1. Field of the Invention

The described technology relates generally to an organic light emitting device that improves a low gray color representation capability.

2. Description of the Related Art

An organic light emitting diode display includes two electrodes and an organic emission layer interposed therebetween, wherein electrons injected from a cathode that is one electrode and holes injected from an anode that is another electrode are bonded to each other in the organic emission layer to form excitons, and light is emitted while the excitons discharge energy.

In a contemporary high efficiency organic light emitting device, when element performance is improved such that a driving current value of the organic light emitting device is more than an initial threshold value, emission efficiency of the element is suddenly increased in a low current application region such that unstable color expression of the low gray region is generated.

When controlling a low brightness region of the organic light emitting device by the current, the current efficiency is suddenly better such that a deviation of the driving current of the thin film transistor (TFT) appears as a brightness deviation. Particularly, color non-uniformity in the low brightness region is generated in the high efficiency organic light emitting device and is frequently generated in the green organic light emitting element.

The above information disclosed in this Background section is only for enhancement of understanding of the background of the described technology and therefore it may contain information that does not form the prior art that is already known in this country to a person of ordinary skill in the art.

SUMMARY OF THE INVENTION

To solve this problem, the present invention provides an organic light emitting device in which an emission layer uniformly realizes low brightness with low current mobility in a low current for electron mobility of the emission layer to be sensitively changed to an electric field by increasing an energy disorder or a positional disorder through control of a doping ratio or a defect density of the emission layer, to realize stable color expression of the low gray region in the high efficiency organic light emitting device.

An organic light emitting device according to an exemplary embodiment includes: a pixel electrode; a hole auxiliary layer formed on the pixel electrode; an organic emission layer formed on the hole auxiliary layer; an electron auxiliary layer formed on the organic emission layer; and a common electrode layer formed on the electron auxiliary layer. An electric field dependency of electron mobility is increased by increasing an energetic disorder or decreasing a positional disorder for the organic emission layer.

The energetic disorder may be increased by adding a dopant to the organic emission layer.

An amount of the dopant in the organic emission layer may be increased by 3% to 15% compared with an optimized dopant.

The energetic disorder may be increased by increasing a thickness of the organic emission layer.

The thickness of the organic emission layer may be in a range from 10 nanometers (nm) to 60 nanometers (nm).

The energetic disorder may be increased by forming a trap in a band to the organic emission layer.

The positional disorder may be decreased by regularly or densely forming a molecular structure by decreasing a thin film deposition ratio of the organic emission layer.

By the organic light emitting device according to the present invention, the color expression of the low gray region may be stably realized.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings are schematic, and are not illustrated in accordance with a scale. Relative dimensions and ratios of portions in the drawings are illustrated to be exaggerated or reduced in size for clarity and convenience, and the dimensions are just exemplified and are not limiting. In addition, like structures, elements, or components illustrated in two or more drawings use like reference numerals for showing similar features. It will be understood that when an element such as a layer, film, region, or substrate is referred to as being "on" another element, it can be directly on the other element or intervening elements may also be present.

The exemplary embodiment shows an exemplary embodiment in detail. As a result, various modifications of the drawings will be expected. Therefore, the exemplary embodiment is not limited to a specific aspect of the illustrated region, and for example, includes modifications of an aspect by manufacturing.

Hereinafter, an organic light emitting device according to the present invention will be described with reference to FIG. 1 to FIG. 5.

Figure 1:
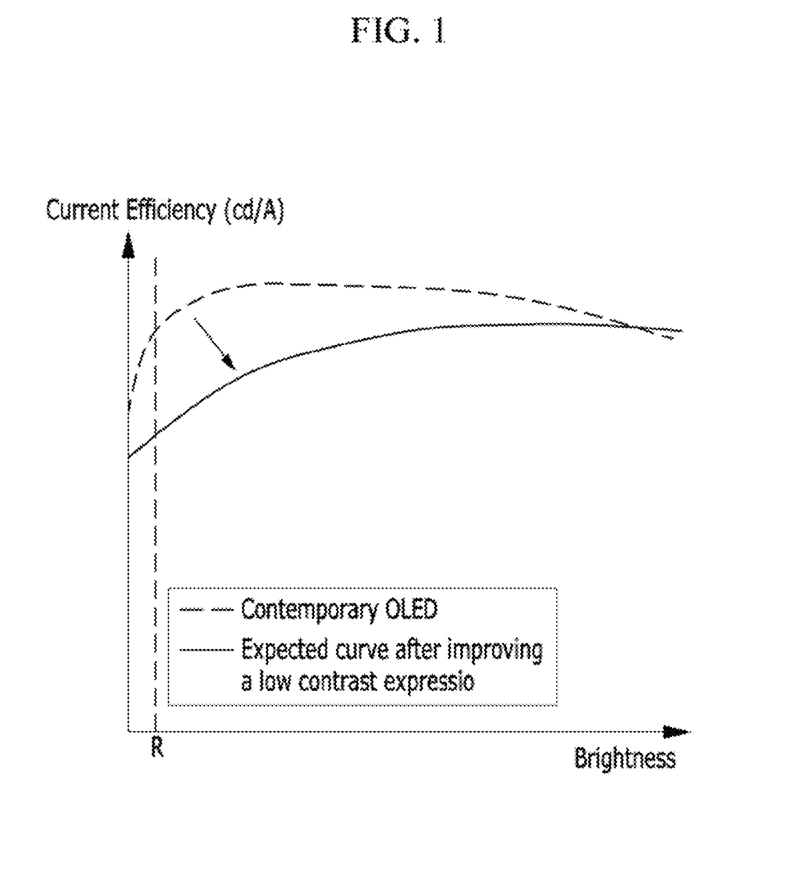
FIG. 1 is a graph of a change of current efficiency for an emission region of an organic light emitting device according to the present invention.

FIG. 1 is a graph of a change of a current efficiency for an emission region of an organic light emitting device according to the present invention. As shown in FIG. 1, current efficiency of a contemporary organic light emitting device is changed according to an emission region, and current efficiency is sharply increased in a low emission (brightness) region, that is, a low gray region. In the low emission region, when the organic light emitting device is controlled by the current, due to the current efficiency that is sharply increased, a deviation of a driving current of a thin film transistor is reflected by a brightness deviation. For example, in a low emission region R, the current efficiency of the contemporary organic light emitting device is sharply increased. By the brightness deviation that is sensitively changed according to the current, color brightness is not stable in the low gray region of the organic light emitting device such that it is non-uniform.

In the organic light emitting device according to the present invention, as shown in FIG. 1, so as to not increase the current efficiency in the low gray region sharply, but to smoothly increase it, electron mobility of the organic emission layer is formed to be dependent on an electric field. An expected curve after expression improvement of the low gray region is shown as a lower curve of FIG. 1. In the low emission region R, the current efficiency of the improved organic light emitting device is expected to smoothly increase.

The organic light emitting device according to the present invention includes a pixel electrode, a hole auxiliary layer formed on the pixel electrode, an organic emission layer formed on the hole auxiliary layer, an electron auxiliary layer formed on the organic emission layer, and a common electrode formed on the electron auxiliary layer. The organic emission layer may be increased with electric field dependency of the electron mobility. On the other hand, the hole auxiliary layer may include a hole injection layer and a hole transferring layer, and the electron auxiliary layer may include an electron injection layer and an electron transferring layer.

An increase of the electric field dependency of the electron mobility may be realized by increasing energetic disorder of the organic emission layer or decreasing a positional disorder.

A Gaussian disorder model (GDM) is used to formulate an electron movement phenomenon of an amorphous organic thin film, and a slope of the electron mobility ($\mu$, mobility) is determined by a constant $\beta$ in a log scale electron mobility graph according to the electric field. The constant $\beta$ is determined by the energetic disorder ($\sigma$) and the positional disorder ($\Sigma$).

The electron mobility ($\mu$) may be represented by equations below.

$$\mu(F, T) = \mu_\infty \exp\left[-\left(\frac{2\sigma}{3kT}\right)^2\right] \exp[\beta\sqrt{F}] \qquad \text{Equation 1}$$

$$\beta = C\left[\left(\frac{\sigma}{kT}\right)^2 - \left(\sum\right)^2\right] \qquad \text{Equation 2}$$

Here, $\beta$ is electric field dependency, $\mu$ is electron mobility, F is the electric field, T is temperature, $\mu_\infty$ is the electron mobility in the limit T→∞, $\sigma$ is energetic disorder, C is a constant, and $\Sigma$ is the positional disorder.

That is, as shown in Equation 2, the constant $\beta$ is large when the energetic disorder ($\sigma$) is large, and the constant $\beta$ is large when the positional disorder ($\Sigma$) is small. As shown in Equation 1, when the constant $\beta$ is large, the electron mobility ($\mu$) is large, and as a result, to efficiently increase the electron mobility ($\mu$), the energetic disorder ($\sigma$) may be increased, and/or the positional disorder ($\Sigma$) may be decreased.

Figure 2:
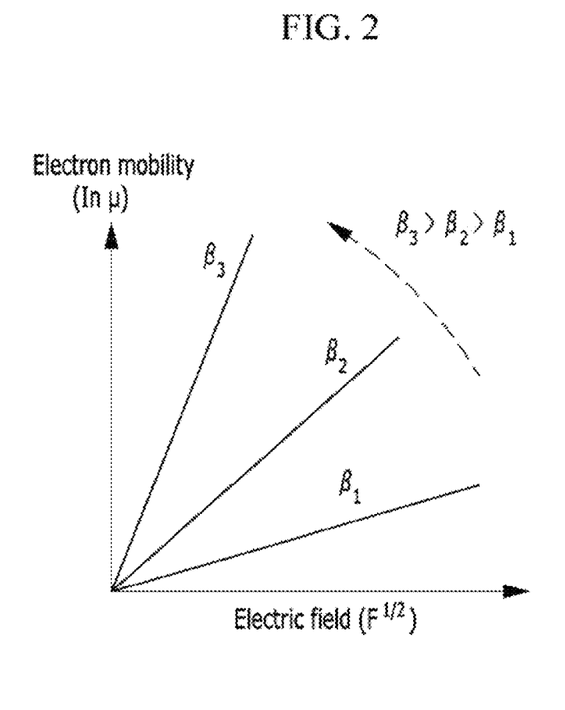
FIG. 2 is a graph showing electron mobility for an electric field applied to an organic light emitting device according to the present invention.

As shown in FIG. 2, it may be confirmed that as the electron mobility ($\mu$) is increased as the electric field dependency ($\beta$) is increased. For example, electric field dependency is increased from $\beta1$ to $\beta3$, the electron mobility ($\mu$) increased correspondingly with the same electric field F.

Figure 3A:
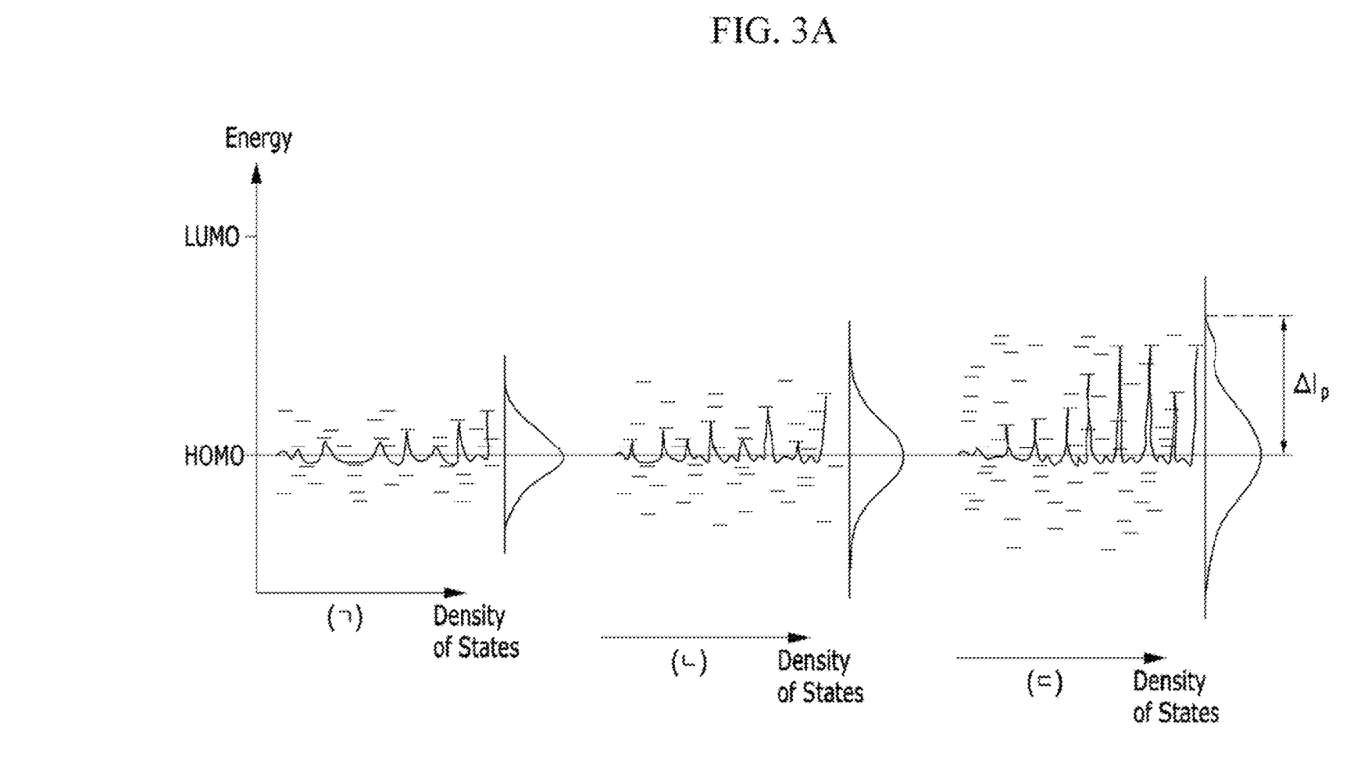
FIG. 3A is a graph showing an effect of an energetic disorder according to an increase in a doping amount of an organic light emitting device in an emission layer according to the present invention.
Figure 3B:
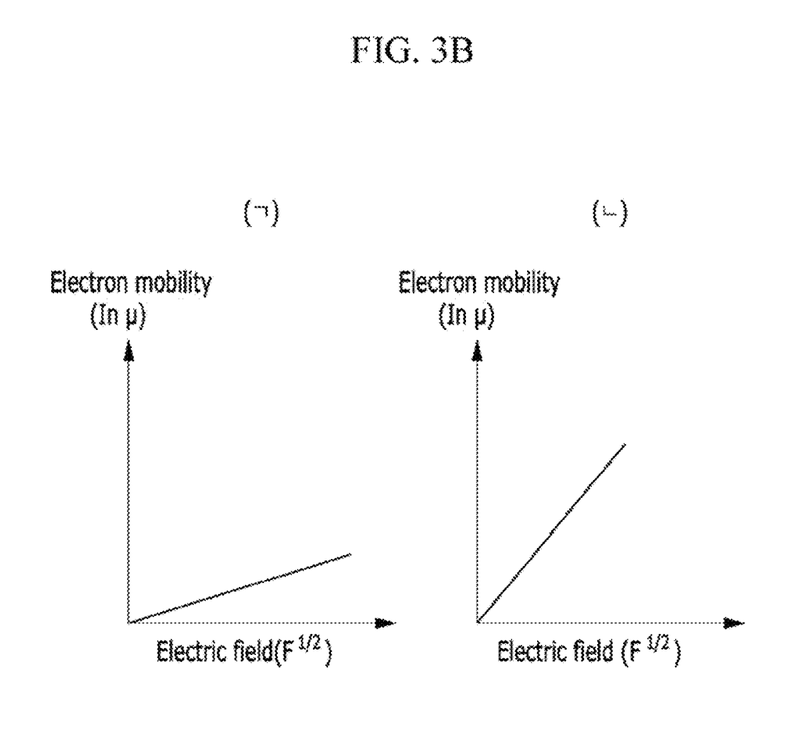
FIG. 3B is a graph showing electron mobility for an electric field in cases in which an energetic disorder of an organic light emitting device according to the present invention that is increased and decreased.

In the organic light emitting device according to the present invention, the energetic disorder ($\sigma$) may be increased by adding a dopant to the organic emission layer. That is, by increasing the doping amount (doping ratio) to the organic emission layer, the energetic disorder ($\sigma$) may be increased. As shown in FIG. 3A, as the amount of the dopant is increased in the organic emission layer, the energetic disorder ($\sigma$) is increased, and as shown in FIG. 3B in which the coordinate systems have the same scale, when increasing the energetic disorder ($\sigma$), the electron mobility according to the electric field is increased. It may be confirmed that the added amount of the dopant in the organic emission layer is increased by 3% to 15% compared with an amount of the optimized dopant for a contemporary device.

Figure 5:
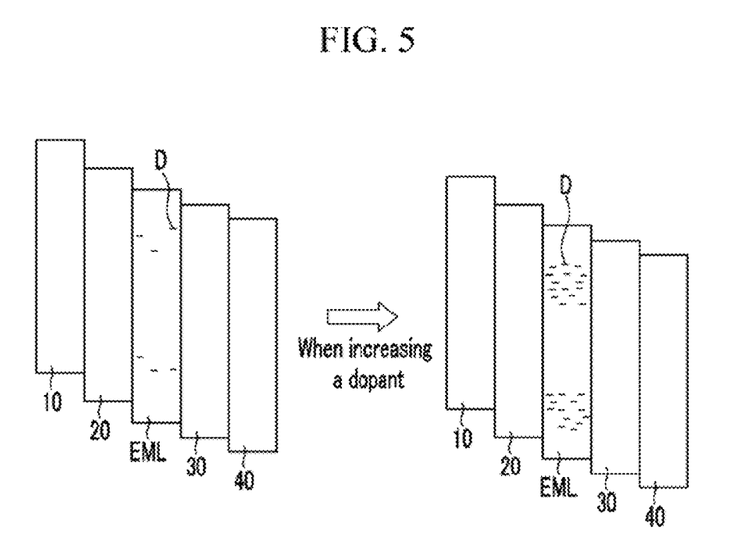
FIG. 5 is a schematic view showing an example in which a dopant is increased to an organic emission layer of an organic light emitting device according to the present invention.

FIG. 5 is a schematic view showing an example in which a dopant (D) is increased to an organic emission layer (EML) of an organic light emitting device according to the present invention. As described above, the organic light emitting device according to the present invention includes the hole auxiliary layer, the organic emission layer EML formed on the hole auxiliary layer, the electron auxiliary layer formed on the organic emission layer EML. The hole auxiliary layer may include the hole injection layer 10 and the hole transferring layer 20, and the electron auxiliary layer may include the electron injection layer 40 and the electron transferring layer 30. FIG. 5 schematically shows an example in which the amount of the dopant (D) is increased in the organic emission layer EML.

On the other hand, in the organic light emitting device according to the present invention, the energetic disorder ($\sigma$) may be increased by increasing a thickness of the organic emission layer. Since the amount of the dopant added for a unit thickness is constant, by increasing the thickness of the organic emission layer, it may be confirmed that the doping amount added to the entire organic emission layer is increased. The thickness of the organic emission layer may be in a range from 10 nanometers (nm) to 60 nanometers (nm).

Moreover, in the organic light emitting device according to the present invention, the energetic disorder (σ) may be increased by forming a trap in a band of the organic emission layer.

Figure 4A:
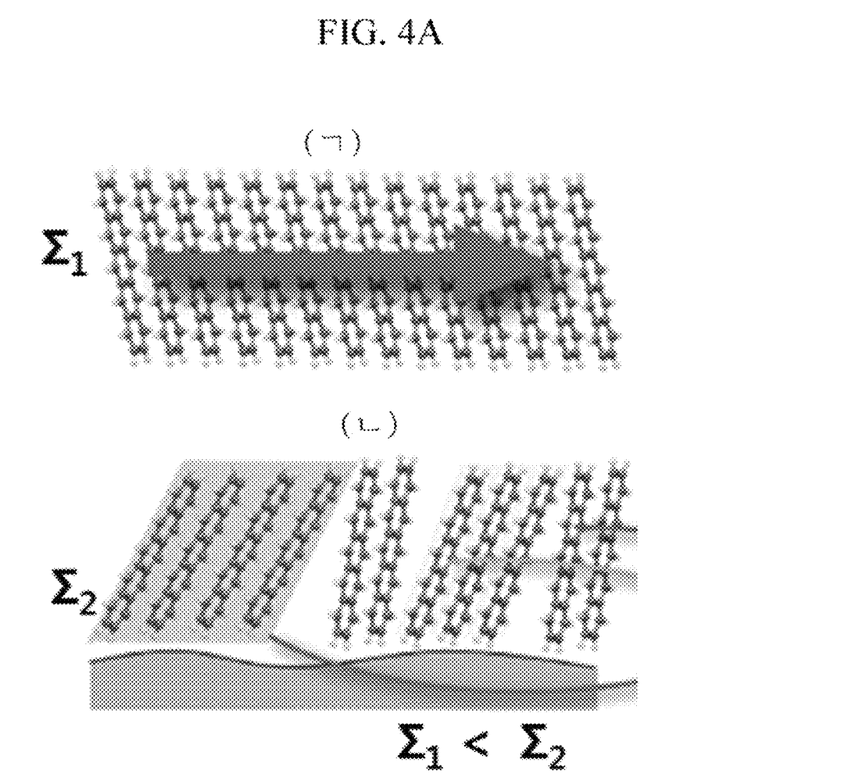
FIG. 4A is a graph showing cases of a positional disorder of an organic light emitting device according to the present invention that is increased and decreased.
Figure 4B:
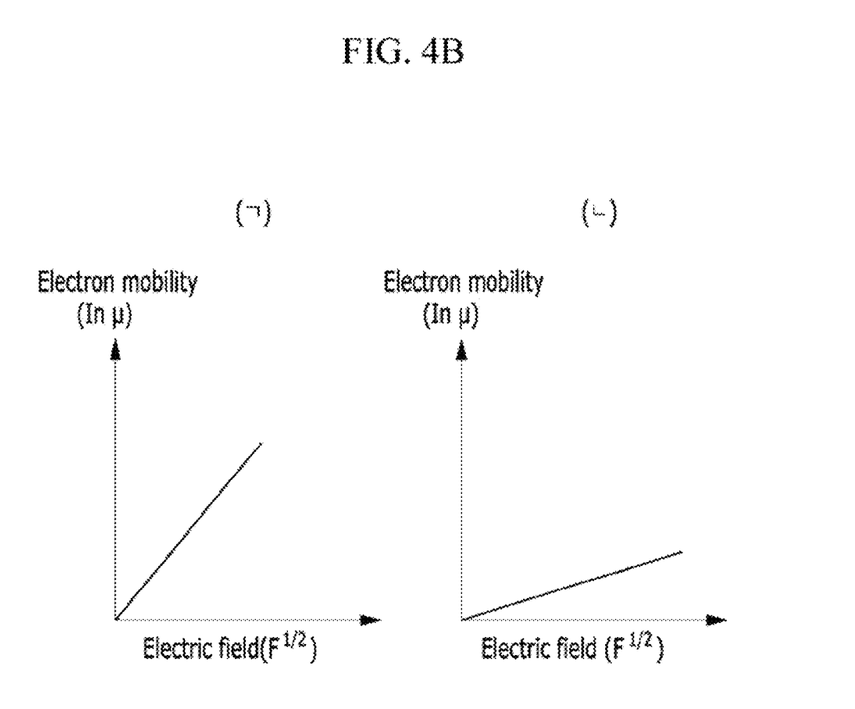
FIG. 4B is a graph showing electron mobility for an electric field in cases that a positional disorder of an organic light emitting device according to the present invention is increased and decreased.

Further, in the organic light emitting device according to the present invention, the positional disorder may be decreased by regularly and densely forming a molecular structure of the organic thin film by decreasing a thin film deposition ratio of the organic emission layer. As shown in FIG. 4A, the molecular structure of the organic thin film is regular and dense (|) and as shown in FIG. 4B in which the coordinate systems have the same scale, the electric field dependency of the electron mobility is further increased (|), and as shown in FIG. 4A, when the molecular structure of the organic thin film is not regular and dense (|), the electric field dependency of the electron mobility is relatively low (|).

As described above, by the organic light emitting device according to the present invention, by increasing the energetic disorder of the organic emission layer or decreasing the positional disorder, the electric field dependency of the electron mobility is increased, thereby realizing uniform brightness in the low gray region. On the other hand, in the described exemplary embodiment, the doping ratio is increased to the organic emission layer or the molecular structure is configured to be regular or dense, however the described configurations may be applied to the hole auxiliary layer or the electron auxiliary layer as well as the organic emission layer, thereby obtaining the same effects.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device, comprising:
  a pixel electrode;
  a hole auxiliary layer disposed on the pixel electrode;
  an organic emission layer disposed on the hole auxiliary layer;
  an electron auxiliary layer disposed on the organic emission layer; and
  a common electrode layer disposed on the electron auxiliary layer;
  wherein the organic emission layer has an increased energetic disorder so as to increase an electric field dependency of electron mobility for the organic emission layer.

2. The organic light emitting device of claim 1, wherein the organic emission layer includes a dopant which is added to the organic emission layer so as to increase the energetic disorder.

3. The organic light emitting device of claim 2, wherein an amount of the dopant in the organic emission layer is increased by 3% to 15% compared with an optimized dopant amount.

4. The organic light emitting device of claim 1, wherein the organic emission layer ha a thickness which is increased so as to increase the energetic disorder for the organic emission layer.

5. The organic light emitting device of claim 4, wherein the thickness of the organic emission layer is in a range from 10 nanometers (nm) to 60 nanometers (nm).

6. The organic light emitting device of claim 1, wherein the energetic disorder is increased by forming a trap in a band to the organic emission layer.

7. An organic light emitting device comprising:
  a pixel electrode;
  a hole auxiliary layer disposed on the pixel electrode;
  an organic emission layer disposed on the hole auxiliary layer;
  an electron auxiliary layer disposed on the organic emission layer; and
  a common electrode layer disposed on the electron auxiliary layer;
  wherein the organic emission layer has a thin film deposition ratio which is decreased so as to regularly or densely form a molecular structure in the organic emission layer, thereby decreasing a positional disorder of the organic emission layer.

* * * * *